US006943480B2

(12) United States Patent
Montuschi et al.

(10) Patent No.: US 6,943,480 B2
(45) Date of Patent: Sep. 13, 2005

(54) SYSTEM FOR CONTROLLING A PIEZOELECTRIC ACTUATOR, IN PARTICULAR FOR THE FUEL INJECTORS OF A DIESEL ENGINE

(75) Inventors: Mario Montuschi, Turin (IT); Eugenio Faggioli, Turin (IT); Paolo Reggio, Turin (IT)

(73) Assignee: C.R.F. Societa Consortile per Azioni, Orbassano (IT)

( * ) Notice: Subject to any disclaimer, the term of this patent is extended or adjusted under 35 U.S.C. 154(b) by 88 days.

(21) Appl. No.: 10/619,482

(22) Filed: Jul. 16, 2003

(65) Prior Publication Data

US 2004/0051421 A1 Mar. 18, 2004

(30) Foreign Application Priority Data

Jul. 16, 2002 (IT) .................................... TO2002A0618

(51) Int. Cl.[7] ................................................ H01L 41/08
(52) U.S. Cl. ................................................ 310/316.03
(58) Field of Search ....................... 310/316.01, 316.03, 310/317, 319; 318/316–318

(56) References Cited

U.S. PATENT DOCUMENTS 4,688,536 A 8/1987 Mitsuyasu et al.
6,081,062 A * 6/2000 Hoffmann et al. ..... 310/316.03
6,137,208 A 10/2000 Hoffmann et al.
6,147,433 A * 11/2000 Reineke et al. ........ 310/316.03
6,617,754 B1 * 9/2003 Knauss .................. 310/316.02

FOREIGN PATENT DOCUMENTS

DE 199 27 087 A1 12/2000
FR 2 793 598 A1 11/2000

* cited by examiner

*Primary Examiner*—Mark Budd
(74) *Attorney, Agent, or Firm*—Sughrue Mion, PLLC

(57) ABSTRACT

The system makes it possible to control at least one piezoelectric actuator having a capacitive impedance and includes a source of voltage, a control circuit branch in parallel with the source, in which the actuator is connected in series to two electronic switches each having a respective parallel diode; an energy accumulating inductor with one terminal connected between the said switches and the other connected to the voltage source; and an electronic unit operable to control the said controlled switches according to predetermined modes of operation.

18 Claims, 7 Drawing Sheets

SYSTEM FOR CONTROLLING A PIEZOELECTRIC ACTUATOR, IN PARTICULAR FOR THE FUEL INJECTORS OF A DIESEL ENGINE

BACKGROUND OF THE INVENTION

The present invention relates to a piezoelectric actuator control system, in particular for the fuel injectors of a Diesel engine.

Fuel injection systems with valves or fuel injectors operated by piezoelectric actuators have been proposed for some years but are still afflicted by numerous problems. These problems mostly involve the particular properties of piezoelectric actuators and have delayed the development of these systems compared to that of more conventional and more easily controlled arrangements, based on the use of fuel injectors or valves using electromagnets.

A number of the problems which affected systems using piezoelectric actuators have been solved, but only by means of arrangements which were very complex and/or expensive to implement and which have held up the wider application of piezo-electric fuel injectors.

Without attempting to list all the problems affecting such systems, the main disadvantages included:

- tolerances in the performance of different fuel injectors, stability of performance and long term recalibration of characteristics;
- variations in the "size" of fuel injectors of different power;
- problems with replacing items in service in the event of malfunction and set-up problems during manufacture;
- complexity of the wiring systems, problems of safety of operatives (high voltages), emissions of electromagnetic radiation and electromagnetic susceptibility;
- difficulties in carrying out multiple fuel injections close together, in achieving temporally superimposed fuel injections (in different cylinders), and in controlling the partial opening of the fuel injectors, and problems in starting the engine; and
- the need to rationalize circuits of the control, operating and diagnostic systems.

SUMMARY OF THE INVENTION

The object of the present invention is to provide an improved control system for a piezoelectric actuator, in particular for the fuel injectors of a Diesel engine, which is able at least partially to solve some of the problems outlined above.

BRIEF DESCRIPTION OF THE DRAWINGS

This and other objects are achieved according to the invention by providing a control system of which the main characteristics are defined in the appended claim 1.

Further characteristics and advantages of the invention will become apparent from the detailed description which follows, provided purely by way of non-limitative example, with reference to the appended drawings, in which.

DETAILED DESCRIPTION OF THE INVENTION

Figure 1:
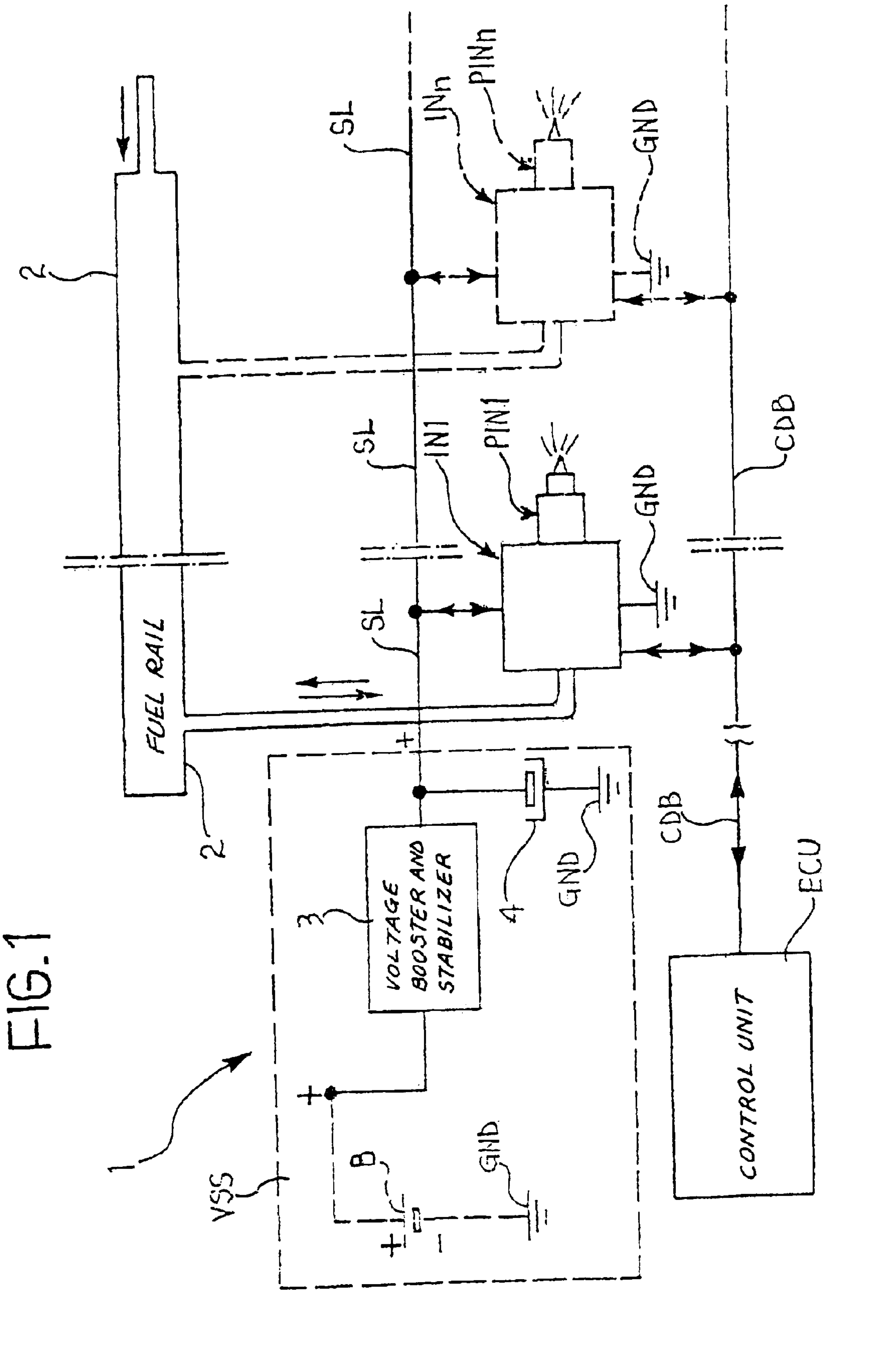
FIG. 1 is partly a block diagram showing the structure of one embodiment of a control system for a piezoelectric actuator according to the present invention.

In FIG. 1, a piezoelectric actuator control system according to the invention is generally indicated 1. This system 1 is intended in particular for the control, piloting and diagnosis of the operation of a plurality of piezoelectric actuators PIN1–PINn connected to a common rail 2 for supply of fuel to a Diesel cycle internal combustion engine.

In the embodiment shown in FIG. 1, each piezo-electric fuel injector forms part of an integrated fuel injection device IN1–INn, also incorporating electronic devices for the control, piloting and possibly also diagnosis of the operation of the fuel injector.

From an electrical point of view, the fuel injection devices or integrated assemblies IN1–Inn are basically connected in parallel between a voltage supply line SL and a ground conductor GND.

The supply line SL is connected to the positive terminal of a DC voltage supply source generally indicated VSS in FIG. 1. The negative terminal of the source VSS is connected to ground GND.

In the embodiment illustrated by way of example in FIG. 1 the voltage supply source VSS includes a battery B, such as a normal motor car battery with a nominal voltage of around 14V. This battery is connected to the input of a voltage booster and stabilizer circuit 3, of a type which is known per se, operable to supply at its output a higher voltage than the battery B, for example a voltage with a nominal value of about 42V.

It is convenient if a high capacity tank capacitor 4 is arranged between the output of the voltage booster and stabilizer circuit 3 and ground GND.

Neither the values of the DC supply voltage indicated above nor the structure of the voltage supply source VSS described above should be seen as binding or compulsory.

In a possible alternative, the source VSS could include an accumulator battery operable to supply voltage with a nominal value of about 42V, possibly with a tank capacitor arranged in parallel at the output.

The (nominal) value of about 42V is also convenient in view of the fact that this value seems likely to be adopted in future as the standard value for electric/electronic systems in motor vehicles.

With reference to FIG. 1, in the architecture illustrated here by way of example, single fuel injection devices or integrated assemblies IN1–INn are managed by an electronic control unit ECU by means of a control and diagnosis line or bus CDB.

FIG. 1 enables the simplicity of the architecture proposed herein to be appreciated as well as the relative ease with which the various integrated fuel injection devices INi are fitted in the system 1, by connecting them in parallel between the supply line SL and ground GND, and linking them to the control and diagnosis line or bus CDB.

As will be seen more clearly below, each device or integrated assembly INi includes electric/electronic control and monitoring devices, the structure of the electronic control unit ECU thereby being correspondingly "lightened", thus drastically simplifying problems involving heat dissipation and reducing disturbances induced in operation, as well as simplifying connections and wiring.

The control unit ECU can also possibly be "remote", and in particular may be disposed outside the engine compartment or perhaps integrated into another control unit on board the vehicle.

As is known, piezo-resistive actuators, in particular those that have a layered stack structure, have a capacitive-type reactance from an electrical point of view.

Figure 2:
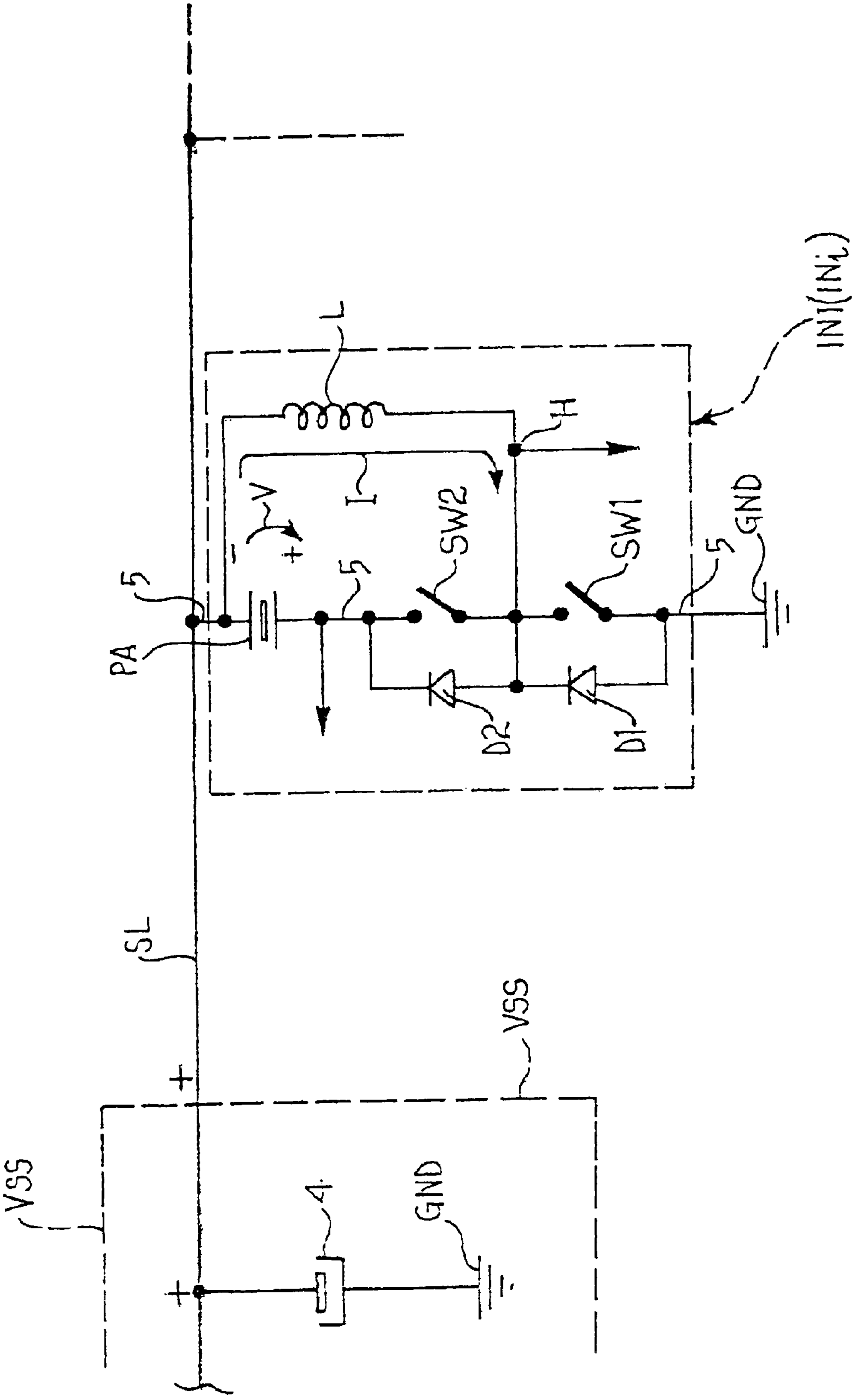
FIG. 2 is an electrical diagram showing a first embodiment of a control circuit branch for a piezoelectric actuator in a system according to the invention.

With reference to FIG. 2 and those following, several preferred architectures will now be described for controlling such a piezoelectric actuator.

FIG. 2 shows a fuel injection device or integrated assembly IN1 comprising a piezo-actuator PA in a control circuit branch 5 which is connected in parallel between the supply line SL and ground GND.

In this control circuit branch, the piezo-actuator PA has a terminal which is connected to the supply line SL, while the other terminal is connected to a series formed by two controlled electronic switches or commutators, indicated SW1 and SW2 respectively. These switches are preferably of a solid state type and each has a respective parallel diode D1, D2, disposed with its cathode towards the positive pole of the voltage supply source VSS.

Conveniently the switches or commutators SW1 and SW2 are transistors of MOSFET type and, in this case, it is advantageous if the respective diodes D1 and D2 are the intrinsic diodes of the transistors.

The switches SW1 and SW2 are substantially connected in a so-called "totem pole". This means that they could be integrated, in one monolithic device.

Still with reference to FIG. 2, each piezoelectric actuator PA has a respective associated energy accumulating inductor L, with one terminal connected between the switches SW1 and SW2 and the other connected to a terminal of the voltage supply source VSS, in particular to the positive pole, by means of the supply line SL.

The switches SW1 and SW2 are controlled by the unit ECU, as will be described better hereinafter, in accordance with predetermined control programmes, as well as in accordance with data acquired by the unit ECU, such as the voltage located in operation on the piezo-actuator PA itself, the current flowing through the associated inductor L, detected by a suitable sensor H, such as a Hall effect sensor, for example, and the like.

With reference to the inductor L associated with each piezo-actuator PA, it can be observed that, in view in particular of its physical incorporation into the fuel injector device which includes the piezo-actuator, it is convenient if its size is very small. This can be achieved by using an inductor with a sintered ferromagnetic core, which has a high current capacity and is adapted for operation at high frequency.

Figure 2A:
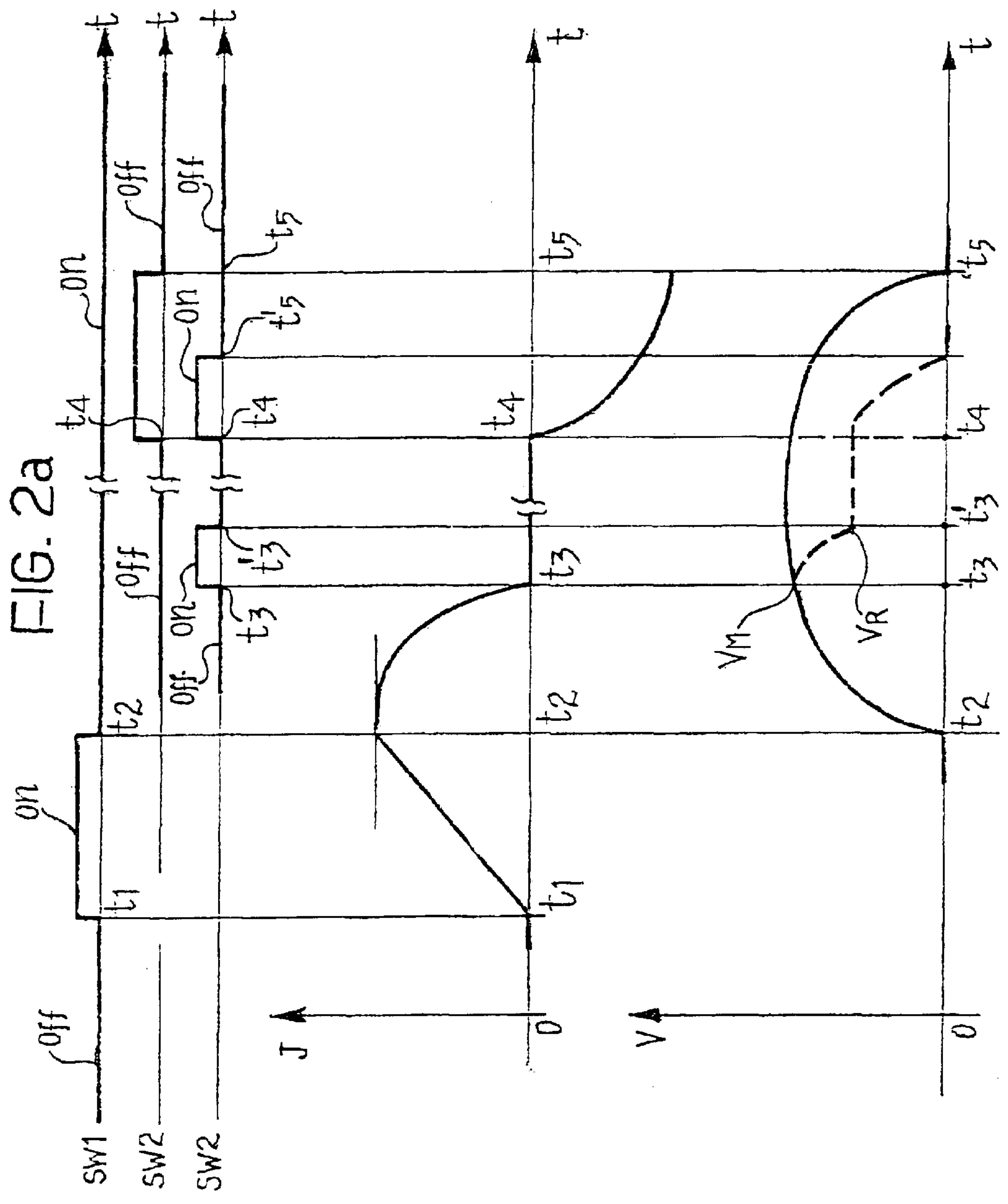
FIG. 2*a* is a series of diagrams which show, by way of example, as a function of time t as abscissa, exemplary patterns of control signals and other electrical quantities in an operating cycle of a system formed in accordance with the circuit architecture shown in FIG. 2.

A brief description follows of the operation of the system according to FIG. 2, with reference to the diagrams given by way of example in FIG. 2*a*.

In order to carry out an injection of fuel, the control unit ECU first checks (instant $t_1$ in FIG. 2*a*) that the switch SW1 is switched to conduction ("closed"), while the other switch SW2 is not conductive ("open"). As a result, the inductor L is connected to the voltage supply source VSS whereby a progressively increasing current I flows into it which is monitored by the control unit ECU by means of the sensor H. As the intensity I increases, the energy $E=LI^2/2$ stored in the inductor L also increases.

When the current I reaches a predetermined value, corresponding to a predetermined value of energy stored in the inductor L, the switch SW1 is turned off ("opened") as shown at the instant $t_2$ in the graphs of FIG. 2*a*. In this condition the current I flows into the network comprising the inductor L, the diode D2 and the piezo-actuator PA. The voltage V (see FIGS. 2 and 2*a*) across the terminals of the piezo-actuator PA then increase from a value of zero, in the manner shown qualitatively by the lower graph of FIG. 2*a*, that is substantially sinusoidally. During this phase the inductor L and the piezo-actuator PA together form a resonant LC circuit, and the voltage V on the piezo-actuator PA increases with a sinusoidal variation, reaching its maximum $V_M$ at the point where the current I (instant $t_3$) becomes zero, in a time period $t_3$–$t_2$ substantially equal to one quarter of the period corresponding to the resonant frequency of the said resonant circuit.

Once the current I is zero, it would "tend" to reverse its sign but this is prevented by the diode D2. The piezo-actuator PA thus remains charged, essentially at the voltage $V_M$ reached at instant $t_3$.

This voltage is able to cause a corresponding dimensional variation in the piezo-actuator PA, enough to cause the associated fuel injector valve or fuel injector to open, thereby providing an injection of fuel.

The duration of the fuel injection is determined by the control unit ECU, in a manner which is known per se.

At the end of the time established for the fuel injection, at the instant $t_4$ the unit ECU commutes the electronic switch SW2 to conduction, as shown in the second graph of FIG. 2*a* (while SW1 remains turned off). In this condition, the inductor L is once again connected to the piezo-actuator PA and the voltage V located thereon can be discharged gradually into the inductor L, causing current I, of opposite sign to the earlier current, to flow into it. The voltage V on the piezo-actuator falls, as shown by the solid line between the instants $t_4$ and $t_5$ in the diagrams of FIG. 2*a*. At the instant $t_5$ the voltage V on the piezo-actuator PA is once again zero and, once it has detected this, the unit ECU turns off the electronic switch SW2.

Once the switch SW2 is turned off ($t>t_5$), current flows from the inductor L towards the voltage source VSS (and in particular into the tank capacitor 4), through the supply line SL on the one hand and through ground and the diode D1 on the other. This provides the advantage of regenerative energy recovery, until the situation in the circuit branch 5 described above returns to its starting condition.

It will be seen that the discharge of voltage V between the instants and $t_4$ and $t_5$ occurs in around one quarter of the period corresponding to the resonant frequency of the circuit formed by the inductor L and the capacitive reactance of the piezo-actuator PA. This characteristic is especially advantageous compared to prior art systems using resonant circuits, in which the times for charging and discharging energy correspond to about half the period corresponding to the resonant frequency.

The arrangement described above thus provides for faster speeds.

A further advantage of the arrangement described consists in the fact that the discharge of the voltage developed on the piezo-actuator PA takes place very rapidly, which is desirable in order to ensure that the fuel injection valve becomes rapidly de-energized, and which is not easily achieved with conventional systems which rely on resonant circuits which operate over half periods of oscillation.

The unit ECU can conveniently be set to control the switches SW1 and SW2 thereby ensuring in particular the initial closure of the switch SW1 for a time $(t_2-t_1)$ which is a function of the desired value of voltage to be achieved on the piezo-electric actuator PA.

Alternatively, the control unit ECU can be set to cause closure of the switch SW2 in anticipation, for example at the instant $t_3$, as shown by the third graph of FIG. 2*a*, thereby initiating a first discharge phase of the voltage V previously present on the piezo-actuator PA until a predetermined lower value $V_R$ is reached. Once this value is reached, at an instant $t'_3$ the unit ECU turns off the switch SW2 once again, so that voltage on the piezo-actuator PA remains essentially at the value $V_R$. This mode of operation makes it possible to speed up the initial "opening" phase of the fuel injection valve, which would otherwise be rather slow, and then to stabilize the voltage on the piezo-actuator at the value $V_R$ corresponding to the desired degree of opening of the valve.

In this case as well, the final discharge of the voltage located on the piezo-actuator PA is determined by the commutation of the switch SW2 to conduction at the instant $t_4$, as shown by the third graph of FIG. 2*a*, until an instant $t'_5$ (earlier than the instant $t_5$) in which voltage V on the piezo-actuator reaches zero.

Typically, as is known, the capacitive reactance of a piezoelectric actuator varies, and in particular increases, as the working temperature increases.

It is therefore convenient if the electronic control unit ECU is set to cause the voltage located on the piezo-actuator PA to decrease as the working temperature rises.

If the electronic switch SW1 used to accumulate energy in the inductor L is a MOSFET transistor, the working temperature can be determined indirectly by measuring the resistance $R_{DSon}$ between the drain and the source of this MOSFET transistor.

Figure 3:
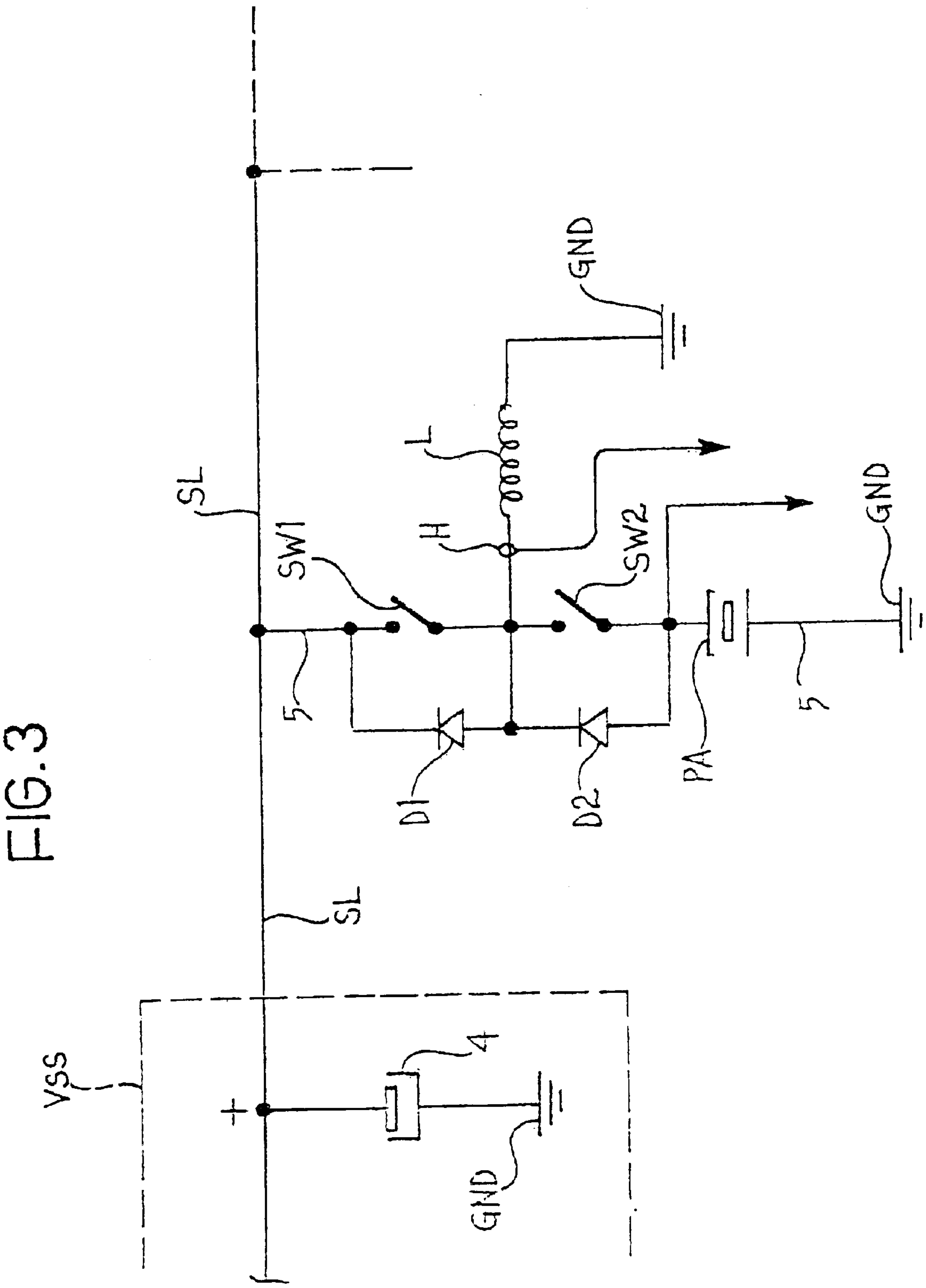
FIGS. 3 and 4 are circuit diagrams of alternative variants of the circuit of FIG. 2.
Figure 4:
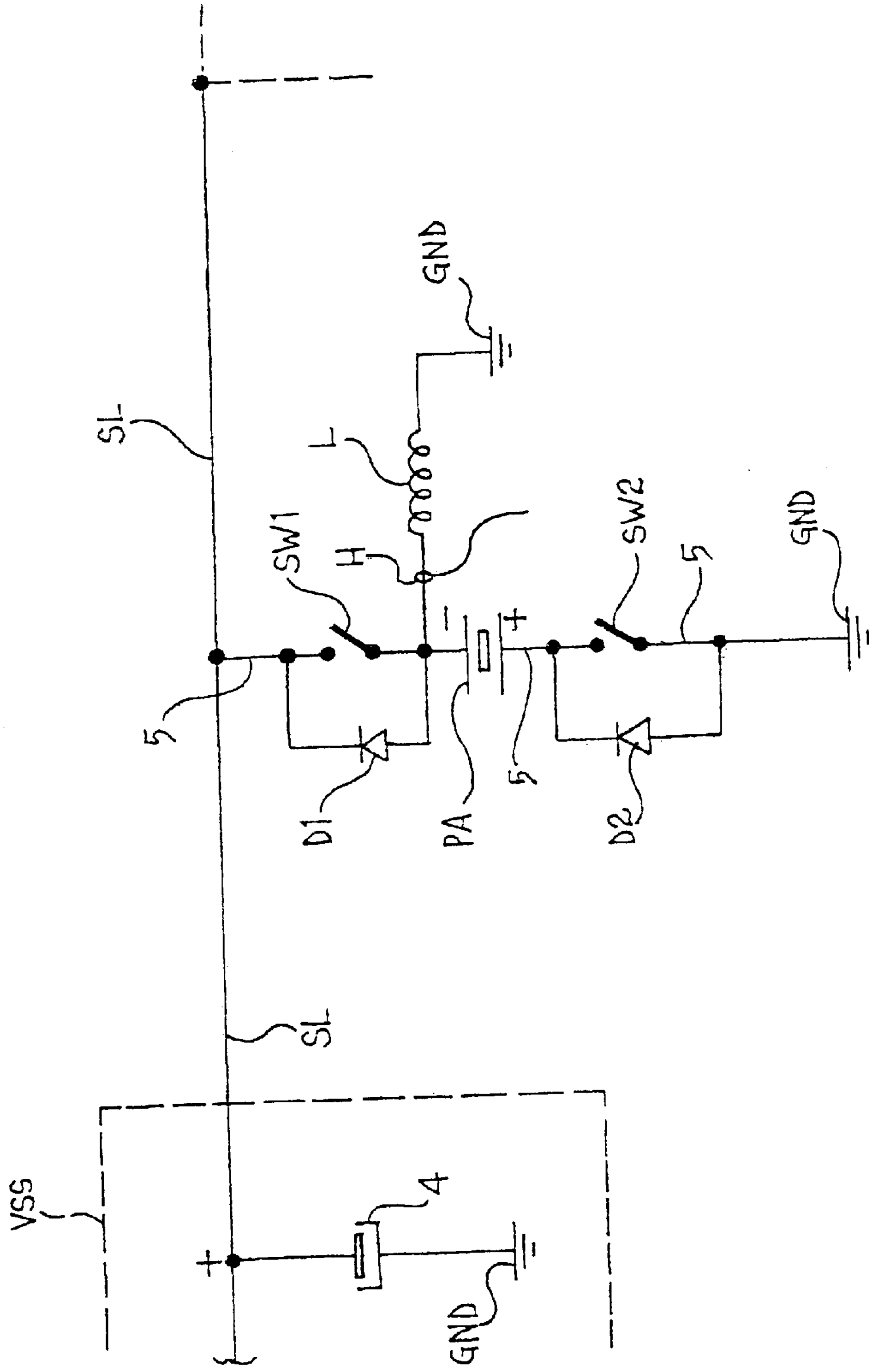

FIGS. 3 and 4, where parts or elements which have already been described have been given the same reference numbers and/or letters used earlier, illustrate variants of the arrangement described above with reference to FIG. 2.

In the version of FIG. 3, the piezo-actuator PA is arranged between ground and the series of electronic switches SW1 and SW2. The inductor L is connected between the switches SW1 and SW2 on the one hand and to ground GND on the other.

It can be seen that in the variant of FIG. 3 the switch which is functionally equivalent to the switch SW1 of FIG. 2 is now the one arranged at the top.

In the variant of FIG. 4 the piezo-actuator PA is interposed between the electronic switches SW1 and SW2, while the inductor L is connected between the switch SW1 (which is at the top in this variant as well) and ground GND.

The variants of FIGS. 3 and 4 operate in the same way as the arrangement described earlier with reference to FIG. 2. Since in these variants the or each switch has a terminal connected to ground, they are better suited to an arrangement in which the circuit components (SW1, SW2, D1, D2, L and the like) associated with the piezo-actuator PA are physically disposed at a distance from this latter, for example in the control unit ECU or in a separate circuit, instead of being integrated in a single fuel injection device or assembly along with the piezo-actuator.

Figure 5:
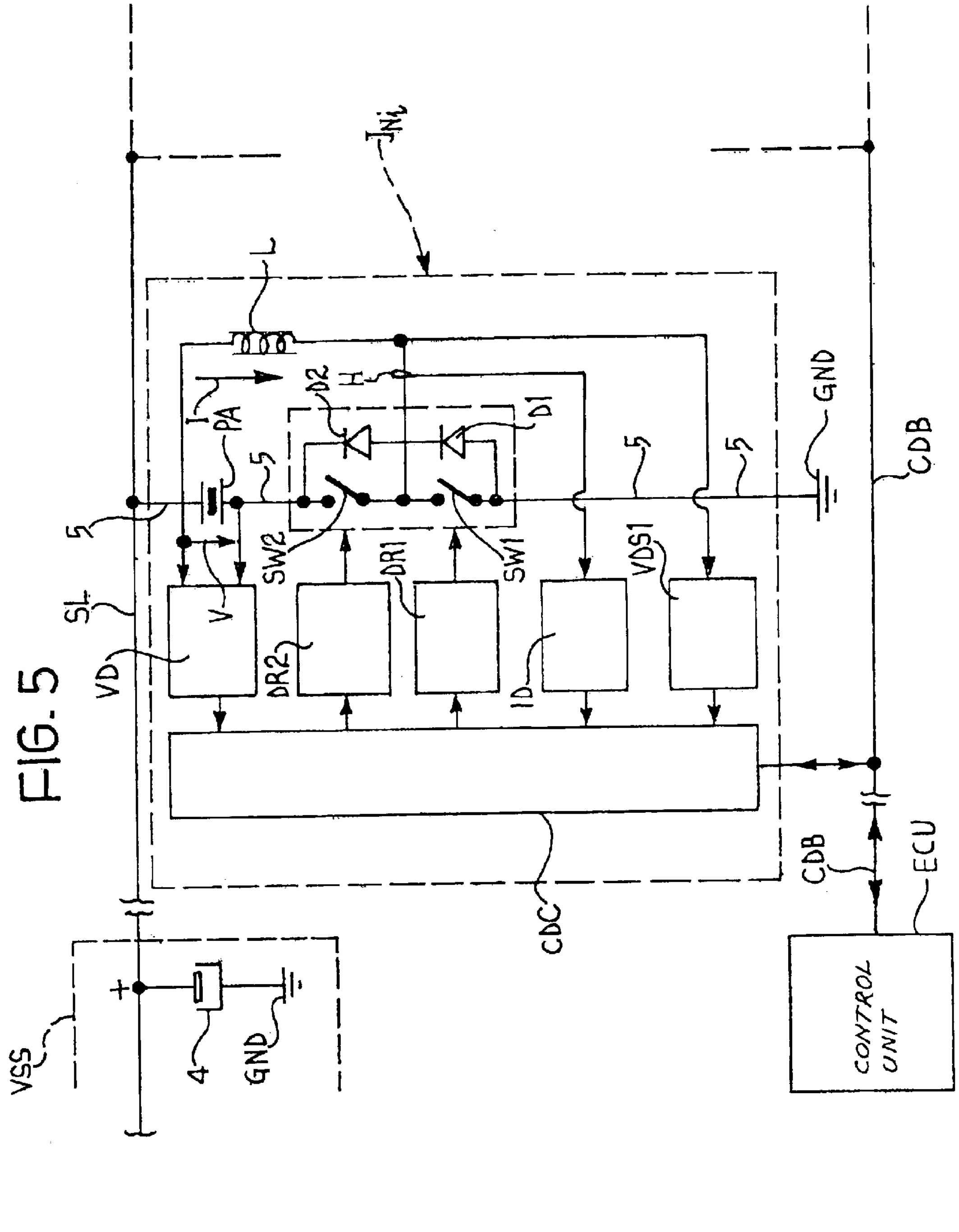
FIG. 5 is partly an electrical block diagram relating to a method of forming a control, operating and diagnostic assembly incorporated into an assembly integrated with the associated piezo-actuator.

FIG. 5 refers on the other hand to an arrangement in which the aforesaid components are physically associated with the piezo-actuator PA, incorporated into a single fuel injection device or assembly $IN_i$. According to the diagram of FIG. 5, the following further devices are included in a generic integrated fuel injection group or assembly $IN_i$:

- a detector device VD for detecting the voltage located on the piezo-actuator PA,
- first and second power control circuits DR1, DR2 connected to the control terminals or electrodes of the electronic switches SW1 and SW2;
- a device ID for monitoring the current, coupled to the sensor H, for detecting the current I flowing through the inductor L in operation, and
- a voltage detector device VDS1, operable to monitor the drain-source voltage of the electronic switch (MOSFET transistor) SW1, ultimately for measuring the operating temperature of the assembly $IN_i$.

The various devices VD, DR1, DR2, ID and VDS1 mentioned above are connected to a logic control and diagnostic device CDC, of a type which is known per se, which can interface with the control unit ECU by means of the control and diagnosistic bus CDB.

The circuit architectures described above make it possible to implement various control modes.

Firstly, they make it possible to carry out fuel injections with different characteristics, for example, standard fuel injections, or multiple fuel injections at each cycle, or perhaps temporally superimposed fuel injections in different cylinders. They also make it possible to carry out fuel injections at pressures which are less than a specified maximum, as well as fuel injections with controlled opening of the fuel injector valve.

All the architectures described make it possible to manage the piezoelectric actuators safely since the energies involved are substantially such as to avoid exceeding the maximum voltage permitted in such piezo-actuators.

Furthermore, the voltage on the piezo-actuators is adequately monitored, as is the current flowing through the accumulator inductors and the piezo-actuators. The maximum avalanche effect voltage VDS of the MOSFET transistors represents an additional safety measure preventing voltage exceeding the maximum permitted for piezo-actuators: the MOSFET transistor switches are able to absorb any energy accidentally produced by intermittent switching irregularities.

In operation, there are no problems with untimely interruption of currents, which are always "recycled".

In embodiments in which the electronic switches, the associated diodes, the accumulator inductor and the like are arranged physically "on" the back of the associated piezo-actuator, there is no problem with dissipation of heat developed by power elements since any heat generated can for the most part be evacuated with the flow of fuel itself. In such embodiments, the relatively high voltage, required in order to control the piezo-actuators, is "confined" within the integrated fuel injection devices, thereby minimizing any electromagnetic radiation. To this end, it is also useful for the tank capacitor 4 to be mounted near the fuel injector devices.

Figure 6:
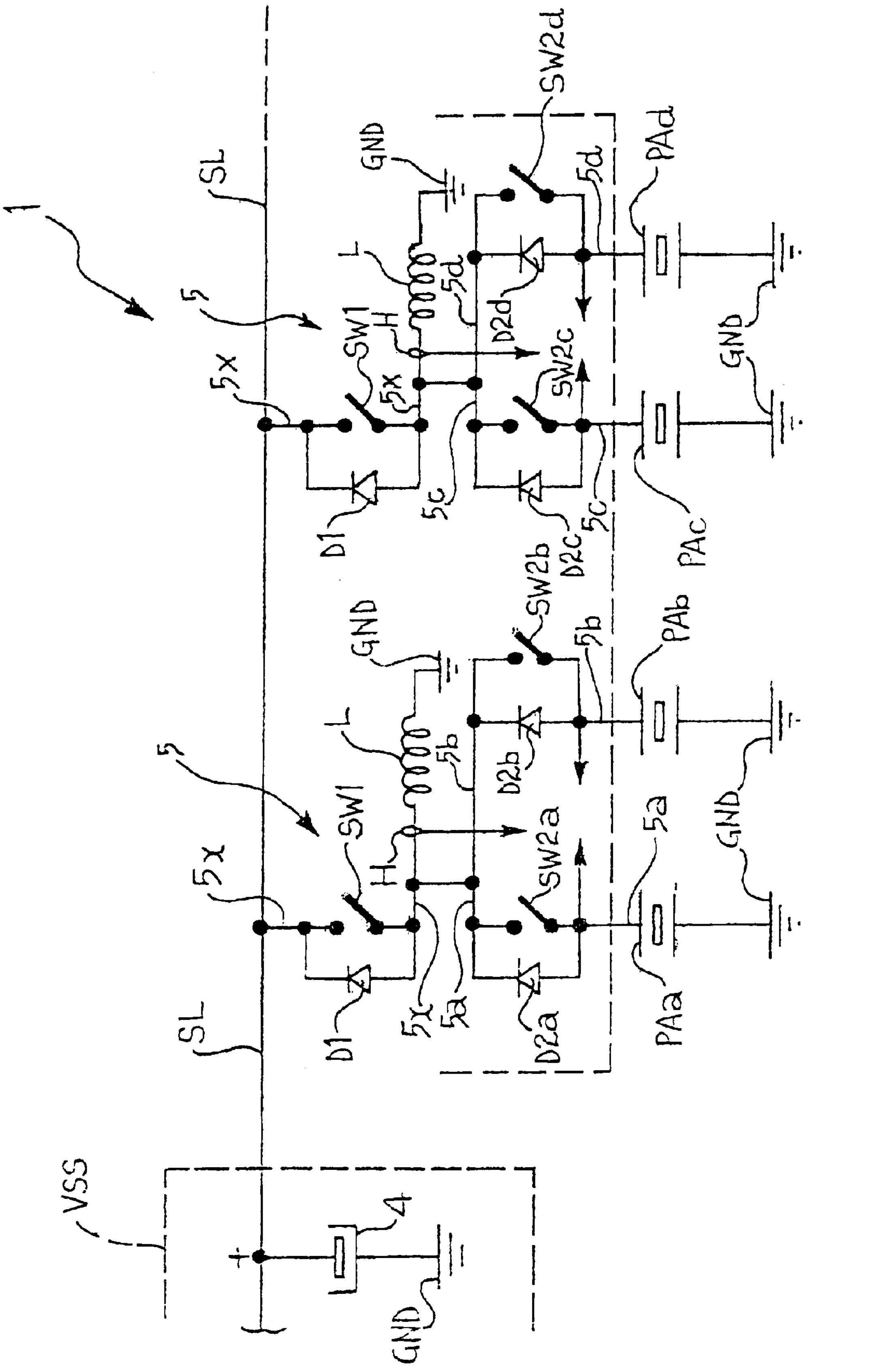
FIG. 6 shows a further circuit variant, an alternative to the circuit of FIG. 2, for use in controlling pairs of piezo-actuators.

FIG. 6 shows a circuit architecture which gives a limited possibility, when controlling the piezo-actuators of fuel injectors, of carrying out temporally "superimposed" fuel injections in two cylinders.

The configuration of FIG. 6 is intended in particular to make it possible to control pairs of piezo-actuators PAa, PAb and PAc, Pad . . . with a substantial saving of components.

In the configuration of FIG. 6 the system includes a plurality of control circuit branches 5, connected to each other in parallel between the supply line SL and ground GND. Each circuit branch 5 comprises two parallel portions indicated 5*a*, 5*b* and 5*c*, 5*d* . . . , each having a respective piezo-actuator PAa, Pab and PAd connected in series to a respective controlled electronic switch SW2*a*, SW2*b* . . . SW2*d*.

Each circuit branch 5 includes a third portion 5*x* between the supply line SL and the aforesaid two portions 5*a*, 5*b* or 5*c*, 5*d*. This third portion 5*x* comprises a controlled electronic switch SW1 which is shared by the corresponding pair of piezo-actuators PAa, PAb or by PAc, PAd.

The mode of operation of the architecture according to FIG. 6 will be apparent per se to anyone skilled in the art and makes it possible to carry out temporally "superimposed" fuel injections, the sole exception being superimposition of the piezo-actuators PAa and PAb or PAc and PAd.

Whatever control architecture is selected from those described above, it is convenient if the or each piezoelectric actuator PA has a respective associated memory, preferably of a rewritable type, for storing data relating to the calibration of the electromechanical characteristics of the actuator. With reference to FIG. 5, these memory devices could be incorporated, for example, into the control and diagnosis circuit CDC.

The data relating to calibration of the electromechanical characteristics of each piezo-actuator PA can be memorized at the end of a production cycle, so that the various piezo-actuators will have the same desired nominal operating characteristic. This characteristic is, for example, one which correlates the quantity of fuel caused to flow as a function of the duration $\tau$ for which the fuel injection valve was open.

In this case the calibration data for this characteristic is such as to keep open for longer (but still within the acceptable limits of the engine) those fuel injectors which have a lower flow rate, as a result of the physical characteristics thereof.

The use of rewritable memory devices makes it possible to "re-calibrate" during the useful life of the device, in particular in the case of fuel injectors for engines with a long life such as those intended for industrial vehicles. In this case, recalibration can be carried out with the use of automatic flow measuring equipment, by rewriting the calibration maps by accessing the control and diagnosis bus CDB.

Naturally, the principle of the invention remaining unchanged, embodiments and manufacturing details may vary widely from those described and illustrated purely by way of non-limitative example, without departing thereby from the scope of the invention, as claimed in the appended claims.

What is claimed is:

1. A control and operating system for at least one piezoelectric actuator having an impedance of a substantially capacitative type, in particular for a fuel injector for a Diesel engine, including a source of DC supply voltage, at least one control circuit branch connected in parallel to the said source and in which the piezoelectric actuator is connected in series to first and second controlled electronic switches each of which has a respective diode connected in parallel, disposed with its cathode towards the positive pole of the voltage source;

at least one energy-accumulating inductor with one terminal connected between said switches and the other terminal connected to a terminal of the voltage source; and electronic command and control means for piloting the said controlled switches so as to cause closure of a first switch while the other or second switch is open, so as to connect the accumulator inductor to the voltage source;

opening of the said first switch when the energy accumulated in the inductor has reached a predetermined value, so that the inductor is then connected to the piezoelectric actuator by means of the diode in parallel with the second switch so as to form a resonant LC circuit, and voltage is progressively located on the piezoelectric actuator operable to cause a reversible mechanical deformation thereof;

subsequent closure of the second switch while the first is open, so as to allow the voltage located on the piezoelectric actuator to be discharged into the inductor, and the reopening of the said second switch when the voltage on the actuator has fallen to a minimum value, in such a way that the residual energy accumulated in the inductor can then flow back towards the voltage supply source.

2. A system according to claim 1, in which the said command and control circuit means are operable to control the said first switch to close for a period which is a function of the desired value of voltage to be reached on the piezo-actuator.

3. A system according to claim 1, in which the said command and control circuit means are operable to control the aforesaid first and second switches in such a way as to:

cause the first switch to close for a predetermined period of time corresponding to a maximum value of voltage to be reached on the piezoelectric actuator and then to cause the first switch to open in order to enable the actuator to be connected to the said inductor, until this maximum value of voltage is reached on the actuator, cause at least a first closure of the second switch so as to cause a partial discharge of the voltage accumulated on the actuator into the inductor, until reaching an operating voltage of a pre-established value on the actuator, and then to open the said second switch, and after a predetermined period of time, to cause the second switch to close again thereby causing the voltage accumulated on the actuator to discharge into the inductor and the said second switch to re-open for a last time when the voltage on the actuator has fallen to the said minimum value, so that the residual energy accumulated in the inductor can flow back towards the voltage supply source.

4. A system according to claim 1, in which, for use with a piezoelectric actuator the electrical capacity of which varies, and in particular which increases with the temperature, the said command and control means are operable to cause voltage on the actuator to decrease as the temperature increases.

5. A system according to claim 1, in which in the said control circuit branch the piezoelectric actuator is connected on one side to the positive pole of the voltage supply source and on the other to the series of first and second switches, and the inductor has one terminal connected to the positive pole of the voltage supply source and the other terminal connected between the said switches.

6. A system according to claim 1, in which, in the said control circuit branch, the piezoelectric actuator is connected on one side to the negative pole of the voltage supply source and on the other to the series of the said first and second switches, and the accumulator inductor has one terminal connected to the negative pole of the voltage supply source and the other terminal connected between the said switches.

7. A system according to claim 1, in which in the said control circuit branch the piezoelectric actuator is interposed between the said first and second switches, and the accumulator inductor has one terminal connected to the negative pole of the voltage supply source and the other terminal connected between the piezoelectric actuator and the said first switch.

8. A system according to claim 1, in which the said switches are MOSFET transistors and the associated parallel diodes are the respective intrinsic diodes.

9. A system according to claim 4, in which the said command and control means are operable to deduce the temperature by detecting the resistance between the drain and the source of the MOSFET transistor acting as the first said switch.

10. A system according to claim 1, in which the said energy-accumulating inductor includes a core of ferromagnetic material, preferably sintered.

11. A system according to claim 1, in which the said voltage supply source includes a battery connected to a voltage booster and stabilizer circuit operable to provide an output supply voltage of a higher value than that provided by the battery.

12. A system according to claim 1, in which the said voltage source is operable to provide a DC supply voltage with a nominal value of about 42V.

13. A system according to claim 1, for the coordinated control of a plurality of piezoelectric actuators, in particular for controlling a corresponding plurality of fuel injectors;

the system including a corresponding plurality of control circuit branches connected to each other in parallel and also to the said voltage source, a respective piezoelectric actuator being arranged in each control circuit branch in series with associated first and second electronic switches with a respective parallel diode and a respective energy accumulating inductor connected between the said switches and a terminal of the said voltage source.

14. A system according to claim 1, for controlling a plurality of pairs of piezoelectric actuators in particular for controlling a corresponding plurality of pairs of fuel injectors;

the system including a corresponding plurality of control circuit branches connected to each other in parallel and connected to the said voltage source; each control circuit branch including a first and a second portion connected to each other in parallel, a piezoelectric actuator being disposed each in series with a respective second controlled electronic switch; and a third portion connected in series to the said first and second portions and which includes a first common controlled electronic switch;

each pair of piezoelectric actuators having an associated common inductor, which can be connected to the voltage source by means of the first common electronic switch.

15. A system according to claim 1, in which the accumulator inductor and the electronic switches and the diodes associated with the or each piezoelectric actuator are incorporated into the piezoelectric actuator thereby forming a single integrated assembly or device.

16. A system according to claim 15, in which the or each integrated assembly further includes one or more of the following additional means:

means for acquiring the voltage developed in operation on the piezoelectric actuator;

means for acquiring the current flowing in operation through the associated energy accumulating inductor;

means for acquiring the voltage across the terminals of the associated first electronic switch;

control circuits for the said first and second electronic switches respectively.

17. A system according to claim 16, in which the additional means are connected to a control and diagnostic device which are adapted to interface with a control unit by means of a control and diagnostic bus.

18. A system according to claim 1, in which the or each piezoelectric actuator has a respective associated memory, preferably of a rewritable type, for the calibration data of the electromechanical characteristic of the actuator.

* * * * *